(12) United States Patent
Lee

(10) Patent No.: US 10,109,621 B2
(45) Date of Patent: Oct. 23, 2018

(54) LOW-CAPACITANCE ELECTROSTATIC DAMAGE PROTECTION DEVICE AND METHOD OF DESIGNING AND MAKING SAME

(71) Applicant: TAIWAN SEMICONDUCTOR MANUFACTURING COMPANY, LTD., Hsinchu (TW)

(72) Inventor: Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 74 days.

(21) Appl. No.: 15/428,631

(22) Filed: Feb. 9, 2017

(65) Prior Publication Data

US 2018/0040602 A1    Feb. 8, 2018

Related U.S. Application Data

(60) Provisional application No. 62/372,179, filed on Aug. 8, 2016.

(51) Int. Cl.
| | |
|---|---|
| *H01L 29/66* | (2006.01) |
| *H01L 27/02* | (2006.01) |
| *G06F 17/50* | (2006.01) |
| *H01L 29/06* | (2006.01) |
| *H01L 29/10* | (2006.01) |
| *H01L 29/786* | (2006.01) |

(52) U.S. Cl.
CPC ...... *H01L 27/0248* (2013.01); *G06F 17/5081* (2013.01); *H01L 29/0653* (2013.01); *H01L 29/1083* (2013.01); *H01L 29/78603* (2013.01)

(58) Field of Classification Search
CPC .................................................. H01L 27/0248
USPC .......................................... 257/173, 328, 355
See application file for complete search history.

(56) References Cited

U.S. PATENT DOCUMENTS

| | | |
|---|---|---|
| 5,563,525 A | 10/1996 | Lee |
| 5,811,856 A | 9/1998 | Lee |
| 7,405,445 B2 | 7/2008 | Huang et al. |
| 7,594,198 B2 | 9/2009 | Chen |
| 8,324,658 B2 | 12/2012 | Tsai et al. |
| 8,334,571 B2 | 12/2012 | Tsai et al. |
| 8,541,848 B2 | 9/2013 | Huang et al. |
| 8,730,626 B2 | 5/2014 | Tseng et al. |
| 8,743,515 B2 | 6/2014 | Yang et al. |
| 8,759,871 B2 | 6/2014 | Song et al. |
| 8,760,828 B2 | 6/2014 | Ma |

(Continued)

FOREIGN PATENT DOCUMENTS

EP    2770538    8/2014

*Primary Examiner* — David Vu
*Assistant Examiner* — Brandon Fox
(74) *Attorney, Agent, or Firm* — Hauptman Ham, LLP

(57) ABSTRACT

An electrostatic discharge (ESD) device includes an active region. The active region includes a first active line having a first plurality of gate features; and a second active line having a second plurality of gate features. The ESD device further includes a first pick-up line having a third plurality of gate features, wherein the first active line is between the first pick-up line and the second active line. The ESD device further includes a second pick-up line comprising a fourth plurality of gate features, wherein the second active line is between the second pick-up line and the first active line.

20 Claims, 8 Drawing Sheets

(56) References Cited

U.S. PATENT DOCUMENTS

| | | | |
|---|---|---|---|
| 8,792,218 B2 | 7/2014 | Tsai | |
| 8,854,778 B2 | 10/2014 | Chu et al. | |
| 8,867,183 B2 | 10/2014 | Chen et al. | |
| 9,035,393 B2 | 5/2015 | Ma et al. | |
| 9,048,655 B2 | 6/2015 | Meng et al. | |
| 9,069,924 B2 | 6/2015 | Chen | |
| 9,117,677 B2 | 8/2015 | Ma et al. | |
| 9,184,586 B2 | 11/2015 | Wang et al. | |
| 9,214,540 B2 | 12/2015 | Tsai et al. | |
| 2006/0274465 A1 | 12/2006 | Wu et al. | |
| 2008/0310061 A1* | 12/2008 | Jeon | H01L 27/0285 361/56 |
| 2012/0088344 A1 | 4/2012 | van Dal | |
| 2013/0119433 A1* | 5/2013 | Wang | H01L 27/0647 257/146 |
| 2014/0175611 A1 | 6/2014 | Hsu | |
| 2014/0217461 A1 | 8/2014 | Song et al. | |
| 2014/0226241 A1 | 8/2014 | Tseng et al. | |
| 2014/0307355 A1 | 10/2014 | Tsai et al. | |
| 2017/0194487 A1* | 7/2017 | Chen | H01L 29/7816 |

\* cited by examiner

_US 10,109,621 B2_

LOW-CAPACITANCE ELECTROSTATIC DAMAGE PROTECTION DEVICE AND METHOD OF DESIGNING AND MAKING SAME

BACKGROUND

Preparing an integrated circuit layout includes analyzing design rules and target parameters of integrated circuits that relate to the performance of an integrated circuit during circuit operation. Designing an integrated circuit layout involves operations performed on a circuit schematic to generate a circuit layout, and instructions for forming the circuit layout. Integrated circuit design rules regulate aspects of an integrated circuit layout. Relevant aspects include proximity of circuit features to each other, spacing between circuit features, feature widths, thicknesses at various levels in an integrated circuit, and the structural parameters of certain circuit elements.

An integrated circuit layout is generated for an integrated circuit design that includes circuit elements such as transistors, interconnects, electrostatic discharge (ESD) protection devices, and input/output structures. Performance of an integrated circuit is modeled using a circuit simulation software computer program according to the design rules that are applicable to the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
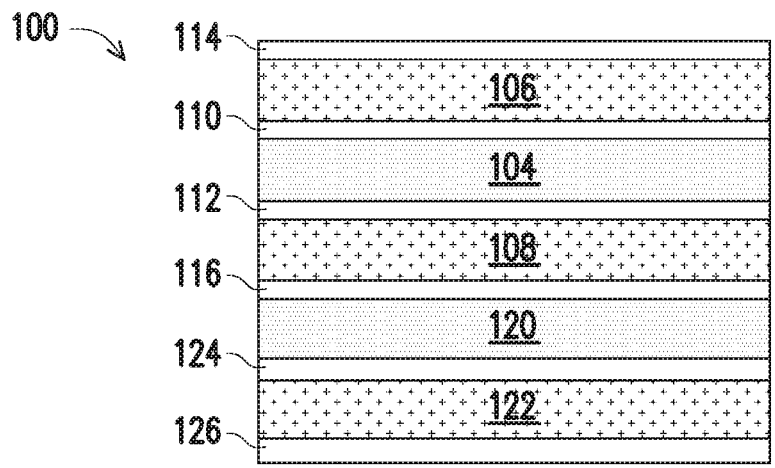
FIG. 1A is a plan view of a portion of a low-capacitance ESD device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not necessarily dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit layout optimization is influenced by front-end-of-line (FEoL) and back-end-of-line (BEoL) circuit parameters. FEoL circuit parameters relate to elements of lower levels of an integrated circuit, including features located at or below a transistor level of the integrated circuit. BEoL circuit parameters relate to elements of the integrated circuit at upper levels of the integrated circuit, including elements relating to inter-level interconnects, such as conductive lines and vias, redistribution wires, and inputs associated with power and communication with the integrated circuit.

Electrostatic discharge (ESD) protection devices (ESD devices) in an integrated circuit help to protect an integrated circuit from damage caused by voltage spikes or elevated current flow in the integrated circuit. Embodiments of ESD devices include a capacitor to help absorb and temporarily store electrical energy associated with the voltage spike or elevated current transient. Embodiments of ESD devices contain resistors to convert some of the electrical energy to thermal energy and to modulate the flow of electrical energy into the ESD device. A lower resistance increases an ability of the ESD device to dissipate current during an ESD event. The combination of capacitance and resistance of the elements of ESD devices, or the RC product of the ESD devices, influences the performance of the integrated circuit, especially radio frequency (RF) circuits, in which the ESD device is located. Some embodiments of ESD devices rely on conductive lines of the device to dissipate current during an ESD event. ESD devices of a FinFET-type structure experience narrow tolerances regarding spacing and width of elements of the ESD devices and the layout of the conductive lines of the ESD devices in the overall integrated circuit layout.

A low-capacitance ESD device is usable with high-speed circuitry, such as a low noise amplifier (LNA) or a serializer/deserializer (SerDes), to help reduce a resistance-capacitance (RC) product of the ESD device. The reduced RC product helps to reduce noise in the high-speed circuitry to help the circuitry operate as designed. A low-capacitance ESD device has a plurality of active lines, each adjoined by an isolation feature, in an active region. An active line includes a plurality of active components, such as field effect transistors. Due to an inherent silicon-controlled rectifier (SCR) circuit formed by bipolar junction transistors (BJTs) in a complementary metal-oxide-semiconductor (CMOS) structure, a latch-up occurs and results in a burnout of the circuit. Therefore, at least one pick-up line, also referred to as a pick-up region, is formed to reduce a substrate resistance in order to help prevent a trigger of BJTs. In some embodiments, a pick-up line adjacent to an N-type transistor is coupled to a first reference voltage, such as a ground voltage, and a pick-up line adjacent to a P-type transistor is coupled to a second reference voltage, such as an operating voltage. The low-capacitance ESD device also has at least one pick-up region, each pick-up region having at least one pick-up line. In some embodiments, in the low-capacitance ESD device, the active region is between pick-up regions.

Gate features of a same active line are separated by a first pitch; and gate features of adjacent active lines are separated by a second pitch greater than the first pitch. A pick-up line includes at least one gate feature. Gate features of a same pick-up line are separated by a third pitch; and gate features of adjacent pickup lines are separated by a fourth pitch greater than the third pitch. A gate feature of an active line is separated from a gate feature of an adjacent pick-up line by a fifth pitch. The fifth pitch is greater than the first pitch and the third pitch. In some embodiments, the first pitch is equal to the third pitch. In some embodiments, the first pitch is different from the third pitch. In some embodiments, the second pitch is equal to the fourth pitch and the fifth pitch. In some embodiments, the second pitch is different from at least one of the fourth pitch or the fifth pitch.

Fins of a same active line are separated by a first fin pitch; and fins of adjacent active lines are separated by a second fin pitch greater than the first fin pitch. A pick-up line includes at least one electrode. Fins of a same pick-up line are separated by a third fin pitch; and fins of adjacent pickup lines are separated by a fourth fin pitch greater than the third fin pitch. A fin of an active line is separated from a fin of an adjacent pick-up line by a fifth fin pitch. The fifth fin pitch is greater than the first fin pitch and the third fin pitch. In some embodiments, the first fin pitch is equal to the third fin pitch. In some embodiments, the first fin pitch is different from the third fin pitch. In some embodiments, the second fin pitch is equal to the fourth fin pitch and the fifth fin pitch. In some embodiments, the second fin pitch is different from at least one of the fourth fin pitch or the fifth fin pitch.

Low capacitance of an ESD device arises from a reduced number of "pairings" between active lines and adjacent pick-up lines in the ESD device. Other ESD device designs surround each active line with a pick-up line on each side of the active line: each active line has two pick-up line "pairings." Because a low-capacitance ESD device combines multiple active lines into a single active region, only active lines at the edges of the active region are "nearest active lines" to pick-up lines in a pick-up region. Thus, for all the active lines in an active area, there is one "pairing" at each boundary between an active region and a pick-up region. Thus, by arranging active lines into fewer active regions of the ESD device, and pick-up lines to pick-up regions at sides of the enlarged active regions, as described above, the capacitance of the ESD device is lower than in an ESD device made according to other layouts.

The capacity of an ESD device to help dissipate electrical energy is proportional to a number of active lines in the ESD device and to a resistance of a dissipation path of the ESD. In a low-capacitance ESD device, capacitance is not linearly proportional to a number of active lines in an ESD device. When designing an integrated circuit, reducing line capacitance and increasing capacity to dissipate electrical energy in an ESD device produces a more responsive ESD device (i.e., a device having a larger value of breakdown current per unit capacitance ($It_2/F$)) in ESD devices connected to a front-end portion of an integrated circuit. A low-capacitance ESD device helps to reduce the capacitance while maintaining a similar breakdown current in comparison with other ESD devices. The reduced capacitance improves performance of the low-capacitance ESD device for use in high-speed circuitry, such as LNAs, SerDes or RFICs.

In other ESD device designs, $It_2/F$ remains approximately constant for all numbers of active lines in the other ESD device designs because capacitance remains nearly constant, depending largely on the number of active line/pick-up line "pairings." A "single layout" integrated circuit uses a single layout or design for ESD devices that compromise between competing design interests of carrying more current, e.g., by increasing a number of active lines or pickup lines, and reducing an RC product, e.g., by increasing spacing between adjacent active lines or pickup lines. Using ESD devices for having a "single layout" integrated circuit results in a protected integrated circuit. In order to help compensate for a high RC product, a capacitance of a low-capacitance ESD device is maintained at or below 30 femtoFarads (fF). As a dimension of active lines or pickup lines decreases, a resistance of the active lines or pickup lines increases.

The low-capacitance ESD device design trait, combining active lines into a single active region, makes using different ESD device layouts for front-end and back-end circuit elements possible. Thus, the design objectives of carrying larger breakdown current and low RC product are decoupled and tailored to front or back-end circuit elements according to circuit design parameters.

An ESD device optimized based on design constraints for front-end circuit element uses a larger number of active lines, allowing larger values of $It_2/F$ (breakdown current), than other ESD devices use for front-end circuit elements. An ESD device optimized based on back-end circuit element uses a smaller number of active lines than for a front-end circuit element, such that a low RC product is available for back-end circuit. By compromising between design constraints, a low-capacitance ESD device is able to provide effective protection for front-end circuit elements without overly limiting the operation of back-end circuit elements for high-speed devices.

FIG. 1A is a plan view of a portion of a low-capacitance ESD device 100, according to some embodiments. Low-capacitance ESD device 100 includes an active region 104, and pick-up regions 106 and 108 on opposing sides of active region 104. Isolation feature 110 is between active region 104 and pick-up region 106. Isolation feature 112 is between active region 104 and pick-up region 108. In some embodiments, isolation feature 114 is on an opposite side of pick-up region 106 from isolation feature 110. In some embodiments, isolation feature 116 is on an opposite side of pick-up region 108 from isolation feature 112. In some embodiments, low-capacitance ESD device 100 includes active region 120 and pick-up region 122. Active region 120 is separated from pick-up region 108 by isolation feature 116. Isolation feature 124 separates active region 120 from pick-up region 122. In some embodiments, isolation feature 126 is on an opposite side of pick-up region 122 from isolation feature 124.

Figure 1B:
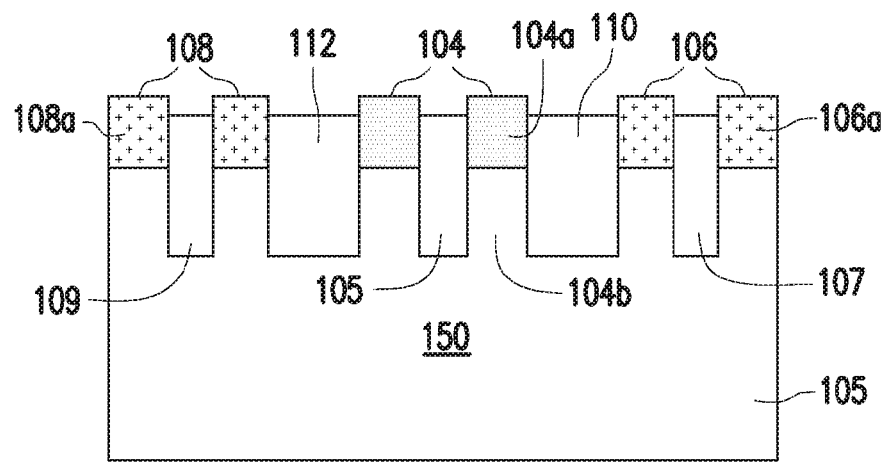
FIG. 1B is a cross-sectional view of a low-capacitance ESD device, in accordance with some embodiments.

An active line is a conductive line or silicon region in an integrated circuit that is adjoined by, or sometimes surrounded by dielectric material (FIG. 1B). Active region 104 has at least two active lines. Active lines in active region 104 have an upper region 104a that is highly doped, extending down a first depth from a top surface of the active lines, and a lower region 104b that continues from a bottom of the upper region to a bottom of the isolation feature adjoining the active line, and has a lower dopant concentration than the active line upper region. Active lines in active region 104 have a first dopant in the upper region 104a. In some embodiments, the lower region 104b of active lines in active region 104 are undoped. In some embodiments, the lower region 104b of active lines in active region 104 are doped with a second dopant of an opposite conductivity type than the first dopant in the upper region 104a of the active line.

FIG. 1B is a cross-sectional view of ESD device 100 in accordance with some embodiments. In FIG. 1B, in the active lines of active region 104 upper region 104a is doped with an N-type dopant, and the lower region 104b is doped with a P-type dopant. A well 150 in the substrate has an opposite dopant type from upper region 104a. In some embodiments, upper region 104a or lower region 104b of an active line is doped with a single dopant. In some embodiments, upper region 104a or lower region 104b of an active line is doped with multiple dopants. In some embodiments, upper region 104a or lower region 104b of an active line is doped with multiple dopants having opposite conductivity types, where a number of carriers contributed by dopants of one conductivity type is greater than a number of carriers contributed by dopants of the opposite conductivity type.

Figure 1C:
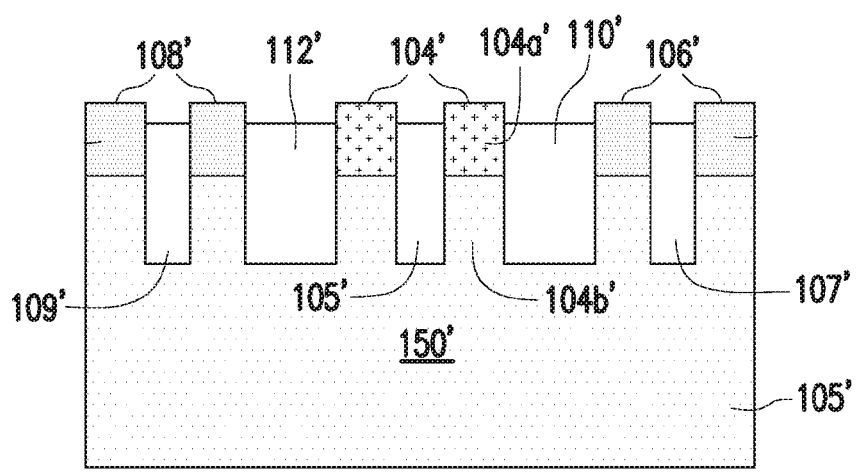
FIG. 1C is a cross-sectional view of a low-capacitance ESD device, in accordance with some embodiments.

FIG. 1C is a cross-sectional view of ESD device 100', in accordance with some embodiments. ESD device 100' is similar to ESD device 100; and similar elements have a same reference number with a prime (') appended. In comparison with ESD device 100, upper region 104a' of an active line is doped with a P-type dopant while the lower region 104b' is doped with an N-type dopant. In some embodiments, the second dopant is the same dopant used to form well 150' beneath the fins of the ESD device. In some embodiments, active lines in active region 104 are fins, having a fin height that is greater than the width of the active line. In some embodiments, active lines in active region have a fin width that is about the same as a fin height above a top of an isolation feature that adjoins the active line.

Returning to FIG. 1A, each active line in active region 104 is separated from every other active line in active region 104 by an interior isolation feature 105. In some embodiments, interior isolation feature 105 includes a same material as isolation feature 110 or 112.

Pick-up regions 106 and 108 each contains at least one pick-up line where each pick-up line includes an upper region 106a and 108a, respectively having a dopant type opposite to the dopant type in the upper region of the active lines in active region 104. In some embodiments, only one pick-up line in pick-up region 106, and only one pick-up line in pick-up region 108, adjoins a boundary isolation feature such as isolation feature 110 or isolation feature 112 on a side of the pick-up region nearest active region 104. A boundary isolation feature is an isolation feature that is located between an active line in an active region and a pick-up line in a pick-up region. Isolation features 110 and 112 are boundary isolation features. In embodiments where at least one of pick-up region 106 or pick-up region 108 contains multiple pick-up lines, adjacent pick-up lines within a pick-up region are separated from each other by interior isolation features 107 and 109 (FIG. 1B). In some embodiments, isolation features 107 and 109 are similar to a boundary isolation feature such as isolation feature 110 or isolation feature 112. In some embodiments, at least one of isolation feature 107 or isolation feature 109 includes a different material from at least one of isolation feature 110 or isolation feature 112.

Capacitance in an ESD device is determined based on a configuration of lines: one active line with a first type of dopant, and one pick-up line with a second type of dopant (opposite the first type of dopant), separated by an isolation feature. In other approaches, ESD devices have alternating active lines and pick-up lines separated by an isolation feature. Thus, each active line in a hypothetical this ESD device has two capacitive interfaces.

Low-capacitance ESD device 100 has multiple active lines in active region 104 and divides the pick-up lines into two pick-up regions, pick-up region 106 and pick-up region 108. Thus, there is a reduced number of capacitive interfaces between active lines and pick-up lines in comparison with other types of ESD devices. In some embodiments of ESD device 100 having three or more active lines in the active region, not only is a number of capacitive interfaces reduced in comparison with a non-low-capacitive ESD device as described above, but low-capacitance ESD device 100 uses a smaller footprint in the integrated circuit because some pick-up lines present in non-low-capacitance ESD device are omitted from the layout of low-capacitance ESD device 100. A footprint reduction factor between low-capacitance ESD devices and ESD devices in other approaches increases (i.e., more footprint space is saved) as the number of active lines in the low-capacitance ESD device increases. A footprint reduction factor is largest when active lines of low-capacitance ESD device 100 are contained in a single active region 104. A footprint reduction factor is reduced by dividing active lines of low-capacitance ESD device 100 into multiple active regions 104 and 120. A footprint reduction factor is increased by sharing, between two adjoining low-capacitance ESD devices, a single pick-up region. For example, pick-up region 108 is shared, in some embodiments of low-capacitance ESD device 100, by active regions 104 and 120.

A well 150 is located beneath the lower regions of fins that make up the active lines and pick-up lines of low-capacitance ESD device 100. In some embodiments, well 150 is doped with a same dopant as the upper regions of pick-up lines in pick-up region 106 and pick-up region 108. In some embodiments, a dopant concentration in well 150 is lower than the dopant concentration in upper regions of the pick-up lines. Active lines in active area 104 are doped with a dopant that is of an opposite conductivity type of the dopant in pick-up region 106, pick-up region 108, and the doped well. In some embodiments, an entirety of the active line is doped with a dopant of the same conductivity type as the dopant in the doped well and an upper region of the active line is doped with at least one dopant of an opposite conductivity type. In some embodiments, a concentration of the first dopant in upper regions of active lines in active region 104 is different from a concentration of the second dopant in the upper regions of pick-up lines in pick-up region 106 or pick-up region 108. In some embodiments, a concentration of the first dopant in upper regions of active lines in active region 104 is the same as the concentration of the second dopant in upper regions of pick-up lines in pick-up region 106 and pick-up region 108.

In some embodiments, low capacitance ESD device 100 includes a pick-up region 122 and an isolation feature 124 situated between active region 120 and pick-up region 122. Isolation feature 116, located at a periphery of low-capacitance ESD device 102, and pick-up region 108, is part of ESD device 118. Low-capacitance ESD device 118 uses pick-up region 108 for electrical isolation purposes to shield active region 120 from circuit elements that adjoin low-capacitance ESD device 100. Pick-up region 108 is between low-capacitance ESD devices 118 and 102. In some embodiments, pick-up lines in pick-up region 108 are similar to pick-up lines in pick-up region 106 and pick-up region 122. Further, active lines in active region 104 are similar to active lines in active region 120. Isolation features 110, 112, 116, and 124 are similar to each other.

In some embodiments, active region 104 has a different number of active lines than active region 120. In some embodiments, active region 104 has a same number of active lines as active region 120. In some embodiments, active lines of active region 104 have a different dissipation path than the active lines of active region 120. In some embodiments, active lines of active region 104 and active lines of active region 120 have a same dissipation path. According to some embodiments, the number of pick-up lines in at least one of pick-up region 106, pick-up region 108, and pick-up region 122 is different from the number of pick-up lines of at least one other of pick-up regions 106, 108, or 122. In some embodiments, the number of pick-up lines in two of pick-up region 106, pick-up region 108, or pick-up region 122 is the same.

Figure 2:
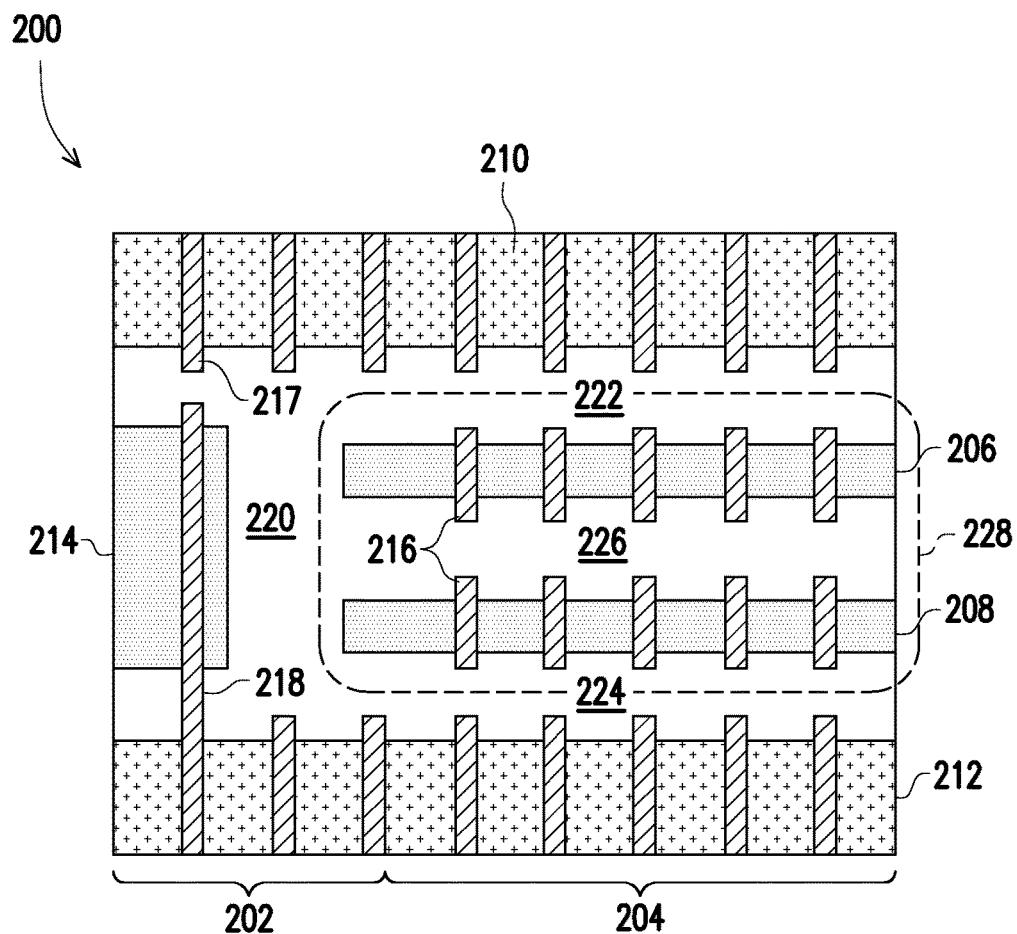
FIG. 2 is a plan view of a portion of a low-capacitance ESD device, in accordance with some embodiments.

FIG. 2 is a plan view of a low-capacitance ESD device 200, in accordance with some embodiments. Low-capacitance ESD device 200 includes a first portion 202 and a second portion 204. A capacitance of first portion 202 is higher than a capacitance of second portion 204. Active lines 206 and 208 are in an active region 228 of a second portion 204 of low-capacitance ESD device 200. A pick-up line 210 is next to active line 206 and a pick-up line 212 is next to active line 208. Active line 214 is located in first portion 202 of low-capacitance ESD device 200 and shares pick-up line 210 and pick-up line 212 with second portion 204. Gate structures 216 above active lines 206 and 208 are formed for process uniformity across the IC to help improve production yield, in some instances. A gate structure is also referred to as a gate feature. Gate structures 216 link only to individual active lines. Gate structure 217 links only to pick-up line 210. Gate structure 218 extends across active line 214 and pick-up line 212. In some embodiments, gate structures 216-218 include polysilicon deposited onto lines of the ESD device 200. In some embodiments, gate structures 216-218 are made of silicon germanium or another conductive material. In some embodiments, a gate structure extends across pick-up region 210, active region 206, active region 208, and pick-up region 212. In some embodiments, a gate structure extends across pick-up region 210, active region 214, and pick-up region 212.

Similar to ESD device 100, ESD device 200 has a current dissipation path from a highly doped upper portion of fins in active regions 206 and/or active region 208; through a well in the substrate; to a highly doped upper portion of fins in pick-up region 210 and/or pick-up region 212. In some embodiments, the highly doped upper portions of fins in pick-up regions 210 and/or pick-up regions 212 are connected to a reference voltage, such as a ground voltage.

An isolation material 220 is located between the active lines in ESD device 200. Isolation material 220, as shown in FIG. 2, is a continuous portion of material that extends around sides of active region 206 and active region 208. Thus, a dielectric material of isolation material 220 has a first portion 222 that acts as a boundary isolation feature between pick-up line 210 and active line 206, and a second portion 224 that acts as a boundary isolation feature between pick-up line 212 and active line 208. A portion of isolation material 220 between active line 206 and active line 208 acts as an interior isolation feature 226 between two active lines of an active region 228. In some embodiments, isolation material 220 includes multiple components and materials to modify a dielectric constant between adjacent lines. In some embodiments, interior isolation feature 226 is a low-dielectric constant (low-κ) dielectric material, with κ<3.9 (the dielectric constant of silicon dioxide is 3.9), and a remainder of isolation material 220 has a dielectric constant of at least 3.9. In some embodiments, first portion 222 and second portion 224 are low-κ (κ<3.9) dielectric materials and a remainder of isolation material 220 has a dielectric constant of at least 3.9.

Figure 3A:
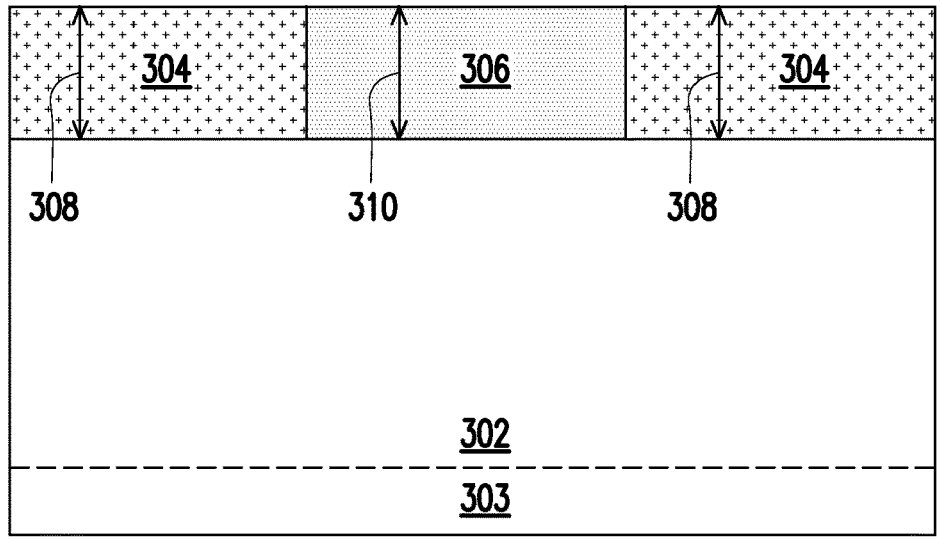
FIGS. 3A-3E are cross-sectional views of a low-capacitance ESD device at various stages of a manufacturing process, in accordance with some embodiments.

FIGS. 3A-3E are cross-sectional views of a low-capacitance ESD device at various stages of a manufacturing process, in accordance with some embodiments. FIG. 3A is a cross-sectional view of low-capacitance ESD device 300 according to some embodiments. Well 302 is in a substrate 303. An upper portion of the substrate material is further doped with a first dopant, to form a first doped region 304, and with a second dopant, to form a second doped region 306. The first dopant in first doped region 304 and the second dopant in second doped region 306 have opposite conductivity types. Dopant atoms added to first doped region 304 are added to a first depth 308. Second doped region 306 is formed to a second depth 310. In some embodiments, first depth 308 is equal to the second depth 310. In some embodiments, first depth 308 is different from second depth 310. According to some embodiments, first doped region 304 is doped with an N-type dopant and second doped region is doped with a P-type dopant. According to some embodiments, first doped region 304 is doped with a P-type dopant and second doped region 306 is doped with an N-type dopant. According to some embodiments, the substrate is an undoped substrate and well 302 is doped with a same type of dopant (N-type dopant or P-type dopant) as first doped region 304. In some embodiments, the first region and/or the second region is doped with a single dopant. In some embodiments, the first region and/or the second region is doped with multiple dopants having a same conductivity type. In some embodiments, second doped region 306 contains the first dopant of first doped region 304 at a same concentration as first doped region 304, and further contains a second dopant of an opposite conductivity type from the first dopant. In some embodiments, dopant atoms are added to first doped region 304 or to second doped region 306 by implanting dopant atoms. In some embodiments, dopant atoms are in-situ doped to first doped region 304 or to second doped region 306. In some embodiments, dopant atoms are added to first doped region 304 or to second doped region 306 by epitaxial growth of a dopant-containing film on the substrate 303, followed by annealing to diffuse dopants into first doped region 304 or second doped region 306.

Dopant distribution is regulated in various embodiments by applying sequential patterned photoresist masks or other patterned masks that facilitate addition of dopants to a particular doped region while masking other doped regions from receiving a dopant being applied in a particular dopant addition step. According to some embodiments, well 302 is formed by implanting a dopant into a substrate to a predetermined depth prior to addition of dopant atoms into either first doped region 304 or second doped region 306. In some embodiments, doped well 302 is formed after adding dopant atoms into first doped region 304 or second doped region 306. In some embodiments, doped well 302 is formed between forming first doped region 304 and second doped region 306. According to some embodiments, the concentration of dopant atoms in first doped region 304 ranges from $1\times10^{-3}$ weight percent (wt %) to around 10 wt %, and the concentration of dopant atoms in second doped region 306 ranges from $1\times10^{-3}$ wt % to 10 wt %. In some embodiments, dopant atoms are added to first doped region 304 or second doped region 306 by implanting at implantation energies ranging from 1 to 40 keV. According to some embodiments, first depth 308 ranges from 1 nanometer (nm) to 100 nm and second depth 310 ranges from 1 nm to 100 nm.

In some embodiments, doped region 304 and doped region 306 are formed after fins are defined. Forming doped region 304 and doped region 306 after defining fins helps to reduce an amount of dopant used during a doping process. In some instances, forming doped region 304 and doped region 306 after defining the fins also helps to define more uniform fins because doping concentrations impact etch selectivity during an etching process used to define fins. In some embodiments, additional doped regions are formed between doped region 306 and well 302 and/or between doped region 308 and well 302.

Figure 3B:
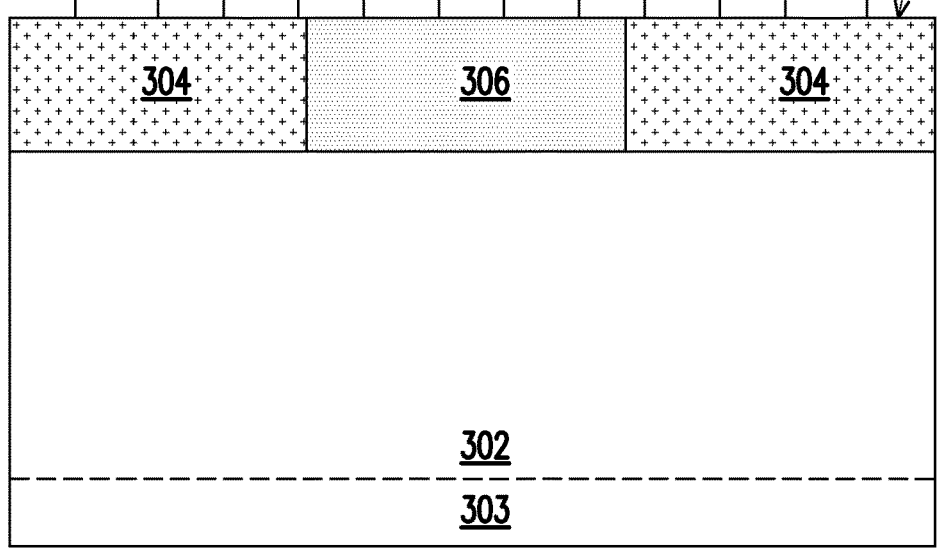

FIG. 3B is a cross-sectional view of a low-capacitance ESD device 312 according to some embodiments. First doped region 304 and second doped region 306 and a portion of a deep well 302 are overlaid with a patterned photoresist 314 on a top surface 315 of the substrate. An etching process, performed subsequent to applying patterned photoresist 314 to top surface 315, defines fins of first doped region 304, of second doped region 306, and of portions of substrate 303. Portions of patterned photoresist 314 above second doped region 306 have, in some embodiments, a first pitch 316 with each portion of patterned photoresist having a first width 318 that corresponds to the width of active lines that will be formed for the ESD device. First pitch 316 is a pitch between active lines to be defined in second doped region 306. Each active line includes a plurality of gate features. A pitch between gate features of an active line is less than first pitch 316. Patterned photoresist 313 is arranged to define two active lines. In some embodiments, patterned photoresist 313 is arranged to define a single active line or more than two active lines. In some embodiments, first width 318 is a same width for each of the active lines defined in second doped region 306. In some embodiments, at least one active line has a different width from at least one other active line.

Portions of patterned photoresist 314 have, above first doped region 304, a second pitch 320 with each portion of the first patterned photoresist 314 having a second width 322 corresponding to the width of pick-up lines that will be formed for the ESD device. Second pitch 320 is a pitch between pick-up lines to be defined in first doped region 304. Each pick-up line includes a plurality of gate features. A pitch between gate features of a pick-up line is less than second pitch 320. Patterned photoresist 314 is arranged to define two pick-up lines. In some embodiments, patterned photoresist 314 is arranged to define a single pick-up line or more than two pick-up lines. In some embodiments, second width 322 is a same width for each of the pick-up lines defined in first doped region 304. In some embodiments, at least one pick-up line has a different width from at least one other pick-up line.

Figure 3C:
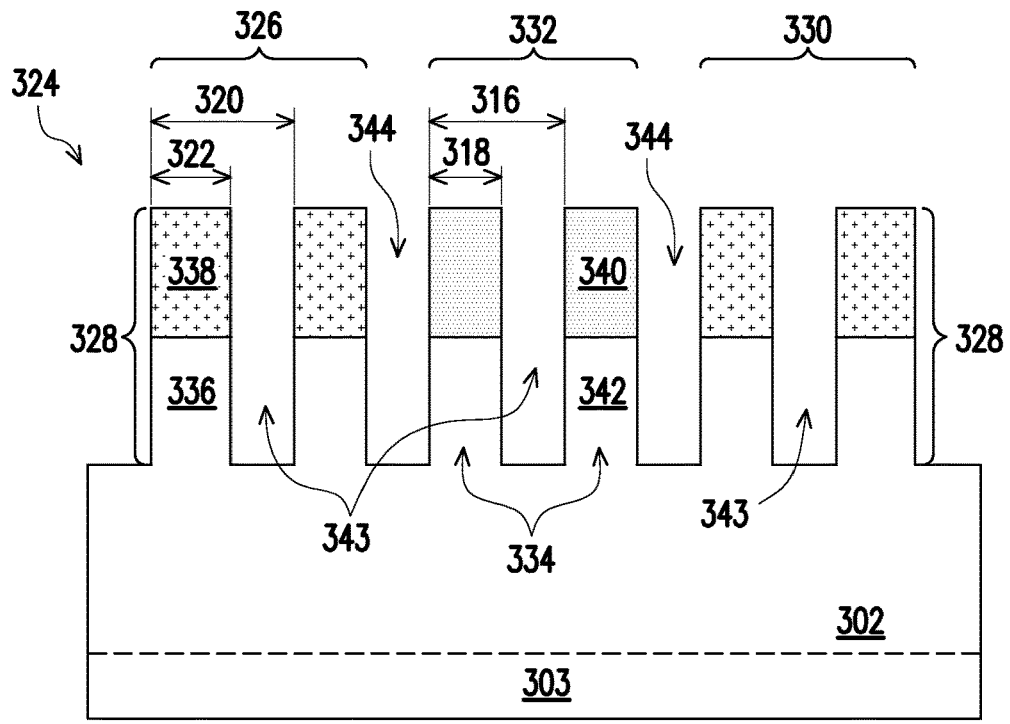

FIG. 3C is a cross-sectional view of low-capacitance ESD device 324, according to some embodiments. First set of pick-up lines 326 includes pick-up lines 328, and second set of pick-up lines 330 also includes pick-up lines 328. Pick-up lines 328 are formed by etching first doped region 304 and a portion of substrate 303. Each pick-up line 328 has a lower region 336 and an upper region 338. Upper region 338 includes material from first doped region 304. In some embodiments, lower region 336 includes material from substrate 303 below the bottom of first doped region 304. A dopant in the upper regions 338 of first set of pick-up lines 326 and second set of pick-up lines 330 is of a same type as the dopant in doped well 302. In some embodiments, at least one of first set of pick-up lines 326 or second set of pick-up lines contain only one pick-up line 328. First set of pick-up lines 326 and second set of pick-up lines 330 are located on opposite sides of a first set of active lines 332. Pick-up lines 328 in first set of pick-up lines 326 and second set of pick-up lines 330 have a second pitch 320 and a second width 322.

Set of active lines 332 comprises at least two active lines 334 extending upward from substrate 303. Active lines 334 in set of active lines 332 are formed by etching second doped region 306 and a portion of substrate 303. Each active line 334 has an upper region 340 from second doped region 306. Each active line 334 has a lower region 342 that includes material from substrate 303 below the bottom of second doped region 306. Active lines 334 have a first pitch 316 and a first width 318.

In some embodiments, first width 318 and second width 322 are the same. In some embodiments, first width 318 and second width 322 are different widths. In some embodiments, first pitch 316 and second pitch 320 are the same pitch. In some embodiments, first pitch 316 and second pitch 320 are different pitches. A width of each pick-up line 328 and each active line 334 is determined according to desired device performance characteristics of low-capacitance ESD device 324 in the integrated circuit. In some embodiments, pick-up line width 322 of pick-up lines 328 in first set of pick-up lines 326 is different from pick-up line width of pick-up lines 328 in second set of pick-up lines 330. In some embodiments, a number of active lines 334 in set of active lines 332 ranges from two to about 20. In some embodiments, a number of pick-up lines 328 in first set of pick-up lines 326 or second set of pick-up lines 330 independently ranges from one to about 20. In some embodiments, a number of active lines is greater than 20. In some embodiments, a number of pick-up lines in at least one of first set of pick-up lines 326 or second set of pick-up lines 330 is greater than 20.

In some embodiments, upper region 340 has both N-type and P-type dopants and a carrier type of upper region 340 is determined by the net difference in contributed carriers (holes or electrons) contributed by the at least two types of dopants in active line upper region 340. A charge carrier of a conductive region of a semiconductor material is determined by the type (or types) of dopant implanted into the conductive region. A region having an N-type dopant conducts current by movement of electrons added to the conductive region by the N-type dopant. A region having a P-type dopant conducts current using holes associated with the P-type dopant atoms in the conductive region. A region having both N-type and P-type dopants conducts electrical current using the carrier type that is surplus (the majority carrier) in the region. When one N-type carrier (an electron) is paired with one P-type carrier (a hole), the two carriers recombine and do not participate in conducting electrical current. The carrier type that is surplus (not recombined with a carrier of opposite type) remains in a doped region to carry current through the region.

Interior trenches 343 between the pick-up lines in the low-capacitance ESD device 324 extend into well 302 to expose an entirety of a sidewall of upper region 338 and a sidewall of upper region 340. Interior trenches 343 extend into substrate 303 to expose a portion of the substrate and well 302. In some embodiments, only upper region 338 and upper region 340 are exposed by interior trenches 343. Interior trench(es) 344 between active lines 334 in low-capacitance ESD device 324 extend into well 302. In some embodiments, a depth of interior trenches 344 is equal to a depth of interior trenches 343. In some embodiments, a depth of interior trenches 344 is different from a depth of interior trenches 343.

Figure 3D:
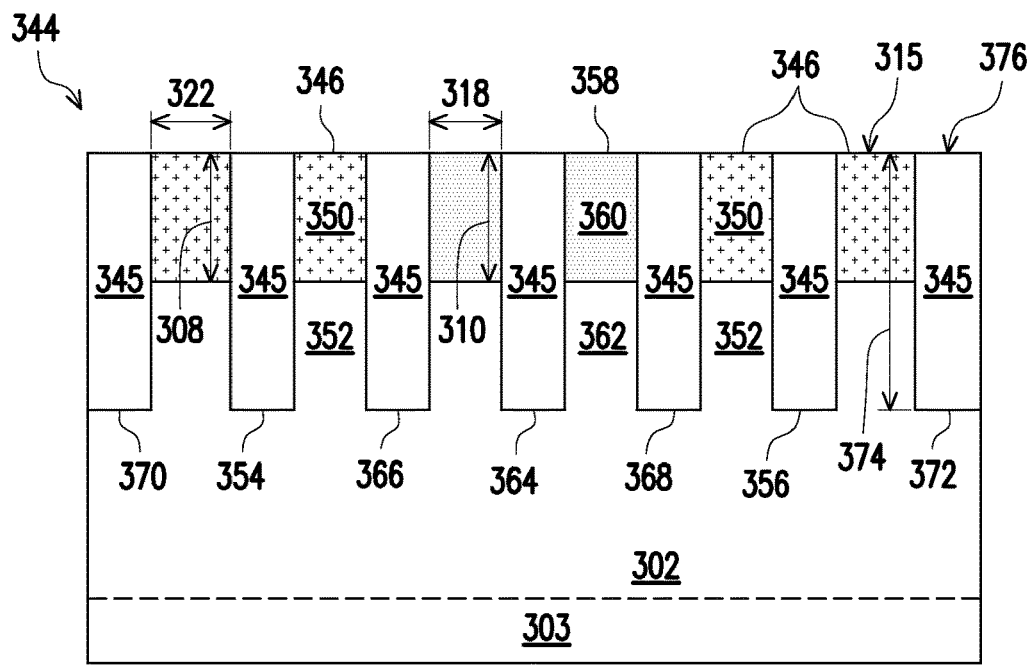

FIG. 3D is a cross-sectional view of low-capacitance ESD device 344 according to some embodiments. Each pick-up line 328 (see FIG. 3C), surrounded by dielectric material 345, is a pick-up line 346. Each pick-up line 346 has upper region 350 and lower region 352. An intermediate isolation feature, such as isolation features 354 and 356, separate pick-up lines 346 from each other.

Each active line 334, surrounded by dielectric material 345, is an active line 358. Each active line 358 has upper region 360 and lower region 362. Each active line 348 of low-capacitance ESD device 344 is separated from another active line 348 by an intermediate isolation feature such as isolation feature 364.

A boundary isolation feature, such as isolation feature 366 or isolation feature 368, separates an active line 348 from a pick-up line 346. Low-capacitance ESD device 344 has peripheral isolation features such as isolation features 370 and 372 at peripheral sides of the device. In some embodiments, isolation features all include a same dielectric material. In some embodiments, the at least one isolation feature includes a different dielectric material from at least one other isolation feature. In some embodiments of low-capacitance ESD device 344, isolation feature 370 or isolation feature 372 is omitted.

In some embodiments, low-capacitance ESD device 344, when compared to an ESD device in other approaches, retains a similar capacity to carry electrical current resulting from an ESD event in an integrated circuit. In an integrated circuit, current-carrying capacity is proportional to a resistance of a dissipation path from upper region 360 through well 302 to upper region 350. In an ESD device in other approaches and a low-capacitance ESD device that have a same current carrying capacity, capacitance is increased because each active line is adjacent to two pick-up lines; and a footprint of the ESD device is increased because of a higher number of pick-up lines. In some embodiments, a number of fins in an active line or a pick-up line is selected to determine a resistance of the low-capacitance ESD device in order to facilitate effective protection of the IC during an ESD event. In some embodiments, every active line has a same number of fins. In some embodiments, at least one active line has a different number of fins from at least one other active line. In some embodiments, every pick-up line has a same number of fins. In some embodiments, at least one pick-up line has a different number of fins from another pick-up line. In some embodiments, at least one active line has a same number of fins as at least one pick-up line. In some embodiments, every active line has a different number of fins from every pick-up line.

Active lines 358 and pick-up lines 346 have approximately the same height 374. Thus, because fin top surface 315 is coplanar with isolation feature top surface 376, isolation features 354, 356, 364, 366, 368, 370, and 372 all have a depth approximately equal to height 374. Upper regions 350 of pick-up lines 346 have first depth 308 and second width 322. Upper regions 360 of active lines 358 have second depth 310 and first width 318. According to some embodiments, a ratio of a height of an active line above a bottom of an adjoining trench (or isolation feature) to a width of the upper region of the active line ranges from about 4:1 to about 2:1. Lines having aspect ratios (of height to width) greater than about 4:1 are prone to breakage during line formation processes, in some instances. Lines having aspect ratios of less than 2:1 are subject to larger parasitic capacitance between doped upper regions of active lines and the doped well below the active lines, in some instances. Further, lines with aspect ratios of the line and the upper region of the line as described herein are less prone to breakdown current flowing through doped well 302 into pick-up lines adjoining the active region where the active lines are located. In some embodiments, a ratio of a height of an isolation feature above a bottom of an adjoining trench (or isolation feature) to a width of the upper region of an active line ranges from about 4:1 to about 2:1. In some embodiments, a ratio of a depth of the upper region of the pick-up line to a width of the pick-up line ranges between about 1:4 to about 1:2. Electrical isolation of the doped upper region of a pick-up line within the range described herein reduces parasitic capacitance between active lines and pick-up lines. Pick-up lines with upper regions that take up less than half the line height are less prone to breakdown through doped well 302 during an ESD event.

Figure 3E:
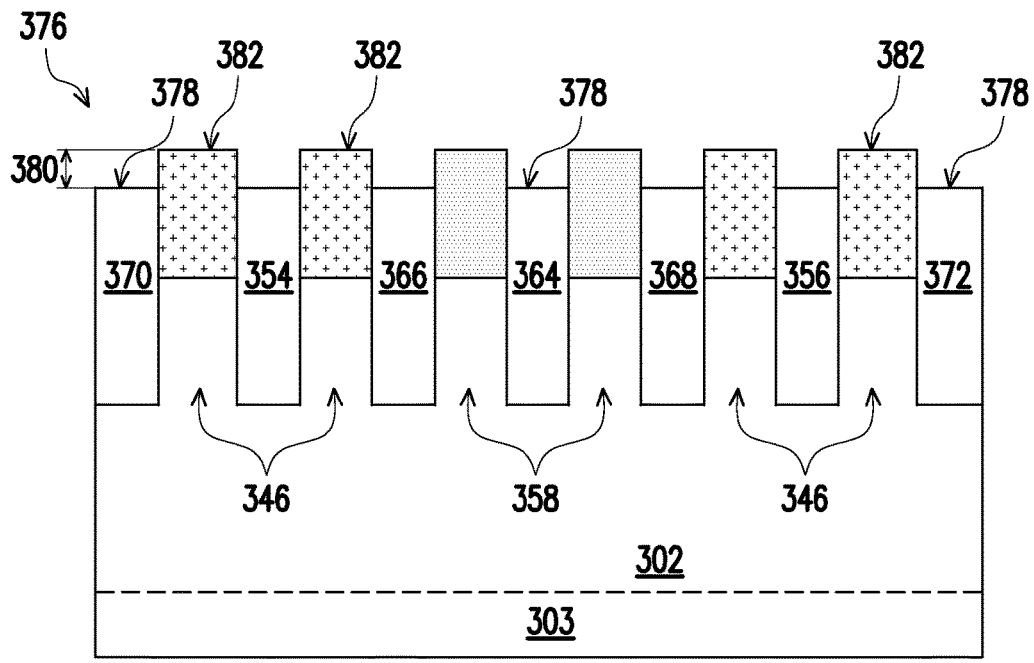

FIG. 3E is a cross-sectional view of a low-capacitance ESD device 376 having active lines 358 and pick-up lines 346 over well 302 in substrate 303. Isolation features 354, 356, 364, 366, 368, 370, and 372 each have a top surface 378 that is recessed to first depth 380 below top surface 382 of active lines 358 and pick-up lines 346 of low-capacitance ESD device 376. Recessing isolation features below a top surface of the pick-up lines and active lines of an ESD device provides a greater surface area for a contact structure to make an electrical connection with a line of the ESD device. Improving the quality and reducing a resistance of the electrical contact between an external connector and an active line or pick-up line of an ESD device improves the ability of the ESD device to carry current from ESD events and prevent damage to the integrated circuit.

Table 1 includes comparative electrical characteristics of a low-capacitance ESD device and an ESD device in other approaches, according to some embodiments. A low-capacitance ESD device as described herein has, for a number of active lines, a smaller footprint than an ESD device in other approaches having a same number of active lines. For an ESD device in other approaches and a low-capacitance ESD device having a similar footprint (achievable by increasing a number of active lines in the low-capacitance ESD device), the current-carrying capacity of the low-capacitance ESD device is around 85% of the current-carrying capacity of an ESD device in other approaches. A resistance of a low-capacitance ESD device is roughly similar to the resistance of an ESD device in other approaches. The ratio of current-carrying capacity to capacitance of the low-capacitance ESD device is around 2.5 times greater than an ESD device in other approaches. In comparison with other ESD devices, a low capacitance ESD device exhibits a significant decrease in capacitance while maintaining a similar resistance. As a result, an RC product of the low-capacitance ESD device is reduced in comparison with other devices. In some embodiments, a capacitance of the low capacitance ESD device ranges from about 10 fF to about 30 fF.

TABLE 1

| | It2 (breakdown current) | FE R(on) | It2/cap (mA/fF) | FE R(on) * Capacitance | BE R(on) * Capacitance |
|---|---|---|---|---|---|
| ESD Device in Other Approaches | 1 | 1 | 1.00 | 1 | 1 |
| Low-Capacitance ESD Device | 0.85 | 1 | 2.47 | 0.34 | 1 |

Figure 4:
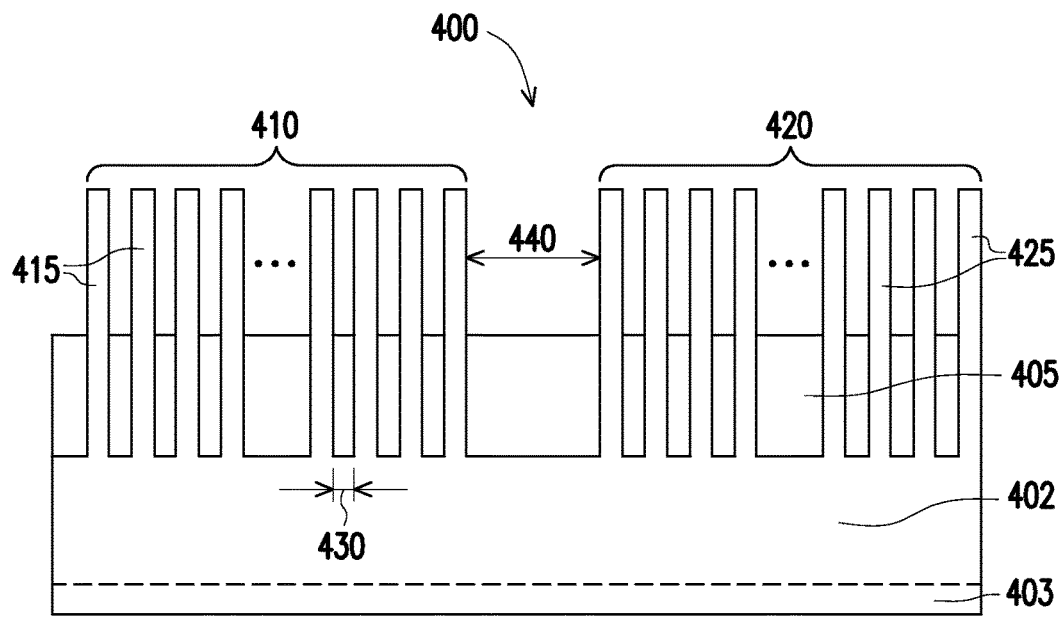
FIG. 4 is a cross-sectional view of an active line and a pick-up line of an ESD device, in accordance with some embodiments.

FIG. 4 is a cross-sectional view of an active line and a pick-up line of an ESD device 400, in accordance with some embodiments. ESD device 400 includes a substrate 403 having a well 402 therein. An active line 410 is over a first region of well 402 and a pick-up line 420 is over a second region of well 402. Active line 410 is similar to active line 358 (FIG. 3E). Pick-up line 420 is similar to pick-up line 346. Active line 410 includes a plurality of fins 415. Pick-up line 420 includes a plurality of fins 425. Portions of fins 415 are separated from each other by a dielectric material 405. Portions of fins 425 are separated from each other by dielectric material 405. A spacing 430 between fins 415 is less than a spacing 440 between active line 410 and pick-up line 420. Each of fins 415 are spaced from adjacent fins 415 by spacing 430. In some embodiments, a spacing between at least one fin 415 and an adjacent fin 415 is different from spacing 430; however, the spacing remains less than spacing 440. In some embodiments, fins 425 are also spaced from each other by a distance less than spacing 440. In some embodiments, fins 425 are spaced from adjacent fins 425 by spacing 430. In some embodiments, fins 425 are spaced from each other by a spacing different from spacing 430, but less than spacing 440. In some embodiments, a spacing between at least one fin 425 and an adjacent fin 425 is different from a spacing between another fin 425 and another adjacent fin 425, but the spacing all remain less than spacing 440.

Figure 5A:
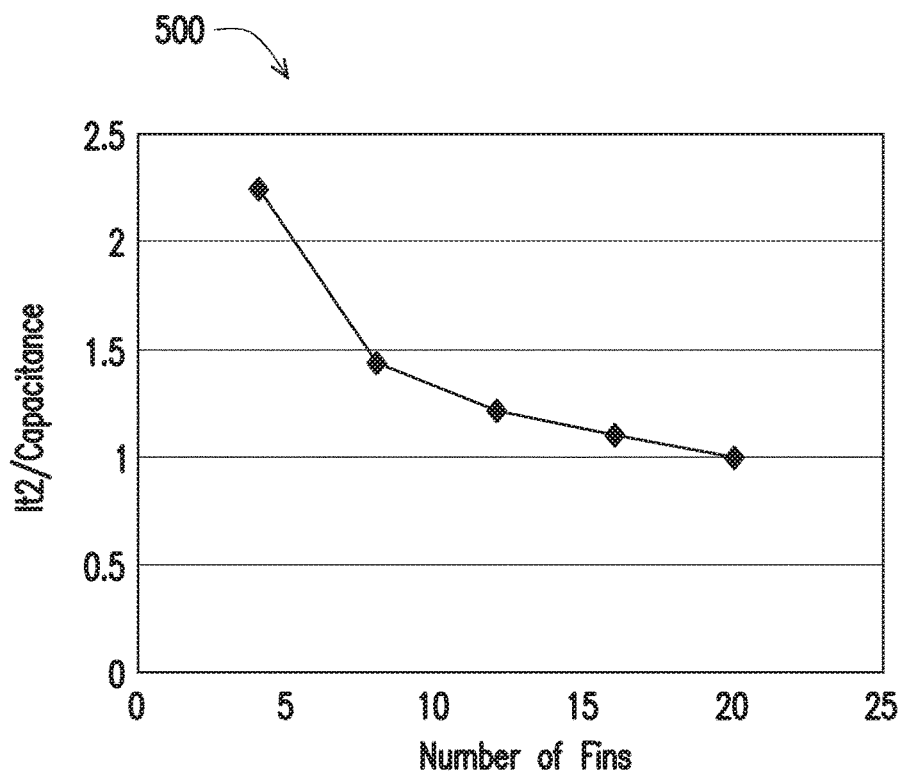
FIGS. 5A and 5B are charts of electrical parameters corresponding to various embodiments of low-capacitance ESD devices.
Figure 5B:
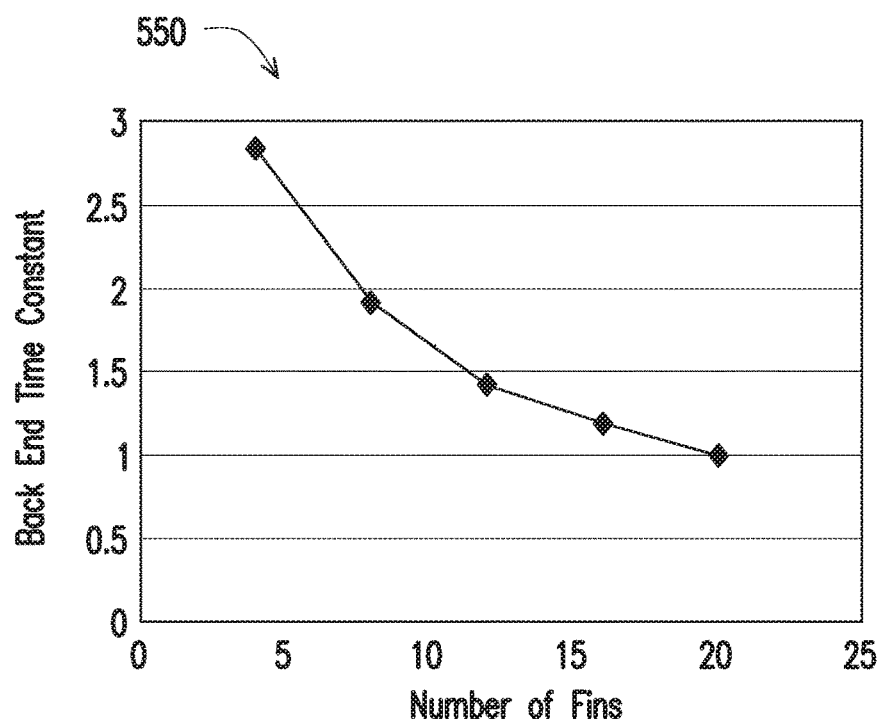

FIGS. 5A and 5B are charts of electrical parameters corresponding to various embodiments of low-capacitance ESD devices. Performance characteristics of front-end components of an integrated circuit are improved by increasing the current-carrying capacity of an electrostatic discharge device, while integrated circuit back-end performance characteristics are improved by reducing the RC constant for an ESD device in the integrated circuit. Plot 500 indicates front-end performance characteristics of an ESD device that includes fins in FinFET-type structure are improved by a larger number of fins of an active line for dissipating current from an ESD event. Plot 550 indicates performance characteristics of back-end components of an integrated circuit connected to an ESD device that includes a FinFET-type structure are improved by reducing the number of fins in the active line to reduce the capacitance of the ESD device in the integrated circuit. In some embodiments, overall performance improvement of an integrated circuit is adjusted to incorporate higher current-carrying capacity of an ESD device by increasing a number of conductive lines or fins in a conductive line of the ESD protection device. In some embodiments, integrated circuit performance is adjusted to incorporate a lower RC product of the ESD device in the integrated circuit by decreasing a number of fins in a conductive line or conductive lines in an ESD protection device. Electrical performance of the ESD protection device reflect a compromise between optimal RC product and current-carrying capacity for different parts of the integrated circuit, in some embodiments.

Figure 6:
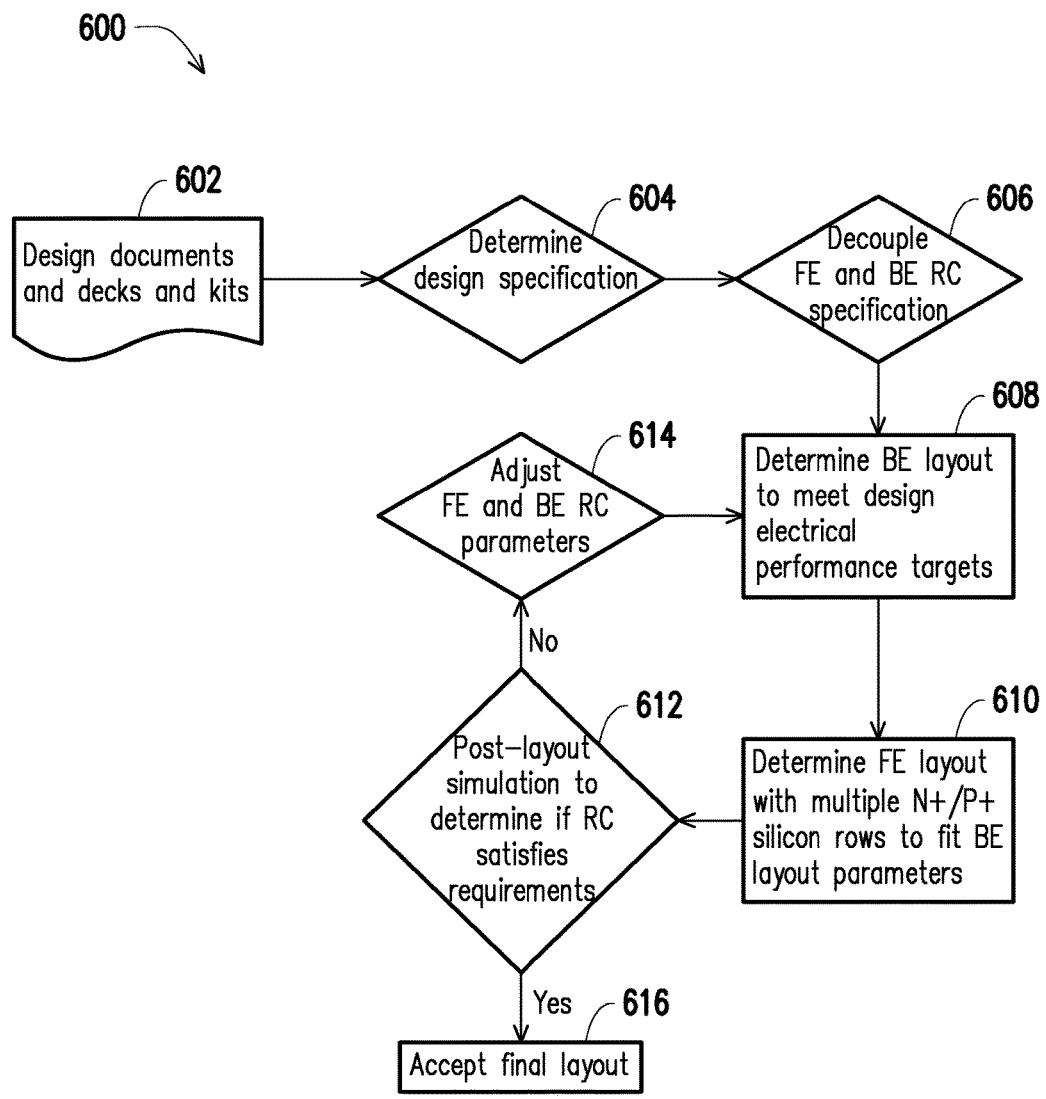
FIG. 6 is a flowchart of a method of adjusting an integrated circuit layout with a low-capacitance ESD device, according to some embodiments.

FIG. 6 is a flowchart of a circuit layout adjustment method 600 for making an integrated circuit layout with a low-capacitance ESD device, according to some embodiments. Circuit layout adjustment method 600 includes an operation 602, where design documents, decks, and kits are analyzed. Circuit layout adjustment method 600 also includes an operation 604 determining and generating design specifications conforming to smooth operation of an integrated circuit. Following determining and generating design specifications for an integrated circuit, the method includes an operation 606 wherein the front-end specification elements and the back-end specification elements are decoupled. Decoupling the front-end specification from the back-end specification means that ESD device performance is analyzed independently for each of the front-end components and back-end components of the integrated circuit. By analyzing the front-end and the back-end of the integrated circuit independently, restrictions on placement of the back-end components is reduced or removed because locations of front-end components, which the back-end components connect, are not imposed on the design of the back-end components at this stage. The increased flexibility in the ESD device design helps to reduce resistance, which increases the ability of the ESD device to dissipate current during an ESD event.

The method includes an operation 608 in which a back-end layout of the integrated circuit, including a layout of the back-end ESD devices, is determined to meet electrical performance targets for the back-end of the integrated circuit. Determining a layout of the integrated circuit, or of portions of the integrated circuit, takes into account the current that flows through adjoining portions of the integrated circuit, the capacitance between elements of the integrated circuit, and the resistance of elements that comprise the integrated circuit. Factors that influence integrated circuit layout include spacing rules between types of circuit elements to avoid dielectric breakdown, dielectric constants of materials between conductive lines, conductivity of materials, presence of barrier layers to reduce or eliminate diffusion of atoms of metals or semiconductors into dielectric materials, known diffusion rates of dopant atoms through dielectric materials and semiconductor materials, a number of transistors or other circuit element types, an amount of cache or on-die storage, a data-bus configuration to communicate data across an integrated circuit during operation, and at least one input/output pathway to transmit information to other parts of a computing system that contains the integrated circuit. Determining a layout of an integrated circuit is performed by inputting at least the above-mentioned factors into a circuit schematic editor to generate a circuit layout and instructions to make the layout that are stored on a storage medium for later transmittal to tools that form the integrated circuit on a semiconductor wafer.

Layout of a circuit is performed to reduce, to the extent possible, the capacitance and resistance of circuit elements while preserving conductivity of electrical pathways of the integrated circuit. Determining a layout of an integrated circuit begins with allocation of space for major portions of the integrated circuit, including transistors, cache or on-die storage, a data bus to connect portions of the integrated circuit to each other, and an array of circuit test elements surrounding an active portion of an integrated circuit that are used to test manufacturing quality of an integrated circuit during a manufacturing process. Following the broad layout of regions of a silicon die for various circuit functions, a further layout operation involves placement of individual transistors, insulating structures, and other circuit elements on the semiconductor wafer within a die footprint. Once an on-die footprint of the circuit elements that are located on or in the semiconductor wafer is determined, subsequent steps of the circuit design process involve planning a three-dimensional pathway of interconnections between the integrated circuit elements on or in the semiconductor wafer, as well as placement of integrated circuit elements that contribute to the overall function of the integrated circuit at higher levels of the integrated circuit. During a circuit design process, spacing between conductive lines, vias connecting levels vertically, and regions left free of conductive lines and vias (such as regions that are filled with through-silicon-vias (TSVs) to connect chips to each other, or to redistribution layers that are fastened to integrated circuits) are mapped out and positioned to reduce capacitance and resistance of the interconnections of the integrated circuit. Interconnection structure and on-die footprint information are stored in a storage medium of the circuit schematic editor and later transmitted to a removable storage medium or over a network to another storage medium for use to make masks and manufacturing instructions for making the integrated circuit.

Determining a layout of the back-end components of the ESD device, in some embodiments, includes determining a number of active lines, a number of fins in each active line, a number of pick-up lines, and/or a number of fins in each pick-up line in the ESD devices for the back-end portions of the integrated circuit. Further, determining a layout of the back-end ESD devices includes determining spacing of adjacent active lines, pick-up lines and fins of the active lines and pick-up lines. A number of lines in the back-end ESD devices is sometimes much larger than a number of lines in a front-end ESD device because reducing the RC product is accomplished by increasing a number of lines in the ESD device. In some embodiments, the number of active lines in an ESD device is as low as four, or as great as 25. In some embodiments, the layout of the back-end components is determined based on user input and/or by an automatic placement and routing (APR) tool.

The method includes an operation 610, in which a front-end layout of the integrated circuit, including a layout of the front-end ESD devices, is determined in order to meet electrical performance targets of front-end portions of the integrated circuit. The layout of the front-end components is based on a location of back-end components in order to provide connections between selected front-end components for the IC to function as designed. In some embodiments, the layout of the front-end components is determined based on user input and/or by an APR tool.

The method includes an operation 612, a post layout simulation of the entire integrated circuit, including both the front-end layout and the back-end layout determined according to operations 608 and 610, is evaluated against a design specification for the integrated circuit determined in operation 604. In some embodiments, the post layout simulation includes a SPICE simulation. In some embodiments, a layout versus schematic (LVS) simulation is also performed. Determining whether the layout of the entire integrated circuit meets a design specification includes, in some embodiments, performing a post-layout circuit simulation process on one or more portions of the integrated circuit individually, and on the integrated circuit as a whole.

Method 600 further includes an operation 614 that is performed when the full integrated circuit layout does not meet the design specification determined in operation 604. In operation 614, the front-end and back-end electrical parameters, including the RC parameters, are adjusted. The adjustment of circuit parameters includes adjustments to a number of active lines in an ESD device, adjusting a number of fins in at least one active line, a number of pick-up lines in an ESD device, adjusting a number of fins in at least one pick-up line, a width of isolation features within an ESD device, an amount of space between an ESD device and a nearest circuit element, an arrangement of circuit elements other than the ESD device, and a total number of ESD devices in the integrated circuit. In some embodiments, these adjustments are performed based on user input. In some embodiments, a processor of a system, e.g., system 700 (FIG. 7) recommends adjustments. Method 600 then returns to operation 608. This cycle repeats until the total layout conforms to the design specification of operation 604. If the post layout simulation indicates that, the total layout satisfies the design specification of operation 604, method 600 proceeds to operation 616 where the layout is processed to begin manufacturing of the IC. In some embodiments, instructions are generated based on the total layout for generating at least one mask for use in manufacturing the IC.

In some embodiments, at least one additional operation is including in method 600. For example, in some embodiments, instructions are generated for creating at least one mask based on the final layout. In some embodiments, at least one operation in method is omitted. For example, in some embodiments, operation 614 is omitted if the total layout meets design specifications. In some embodiments, an order of operations in method 600 is changed. For example, in some embodiments, operation 608 is performed simultaneously with operation 610.

Figure 7:
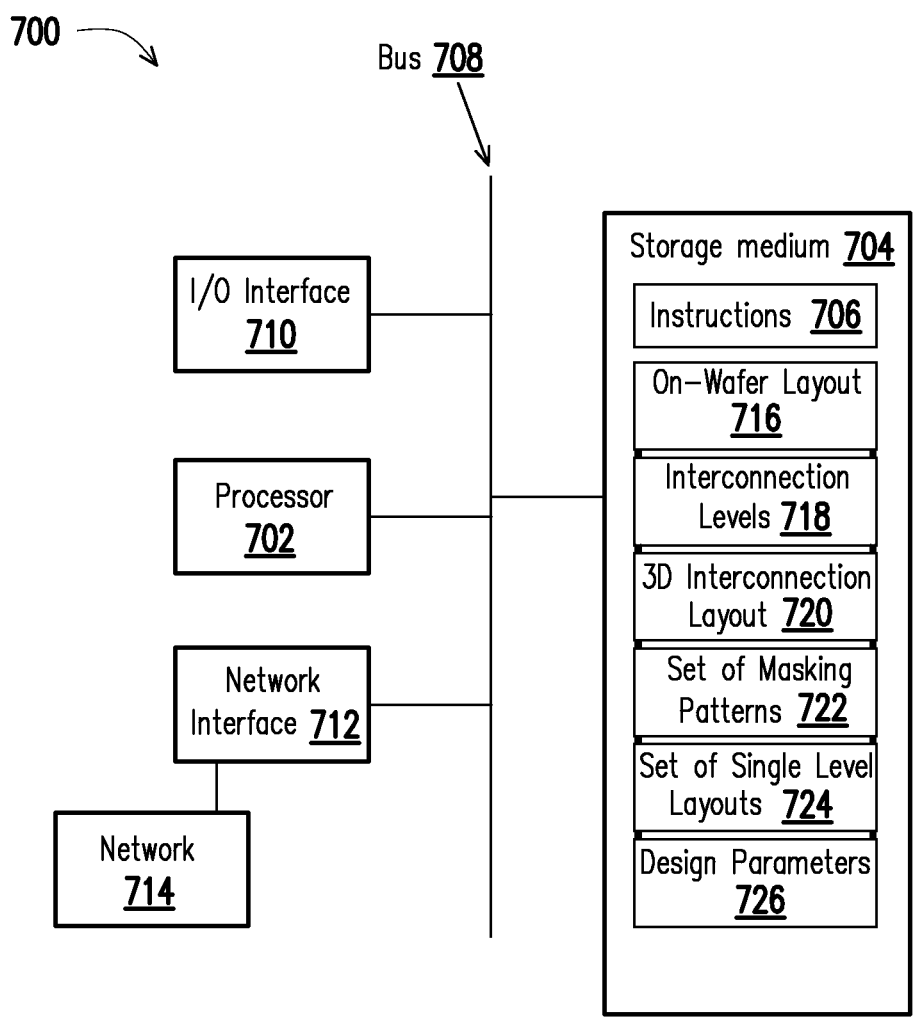
FIG. 7 is a block diagram of a computing device for implementing an integrated circuit design process, according to some embodiments.

FIG. 7 is a schematic view of a system 700 for generating an integrated circuit layout in accordance with one or more embodiments. System 700 includes a hardware processor 702 and a non-transitory, computer readable storage medium 704 encoded with, i.e., storing, the computer program code 706, i.e., a set of executable instructions. Computer readable storage medium 704 is also encoded with instructions 707 for interfacing with manufacturing machines for producing the integrated circuit. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause system 700 to be usable for performing a portion or all of the operations as described in method 600.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores instructions 706 (stored as computer program code) configured to cause system 700 to perform some or all of method 600. In some embodiments, the storage medium 704 also stores information needed for performing a method 600 as well as information generated during performing the method 600, such an on-wafer layout 716 of integrated circuit elements, a number of interconnection levels 718 of the integrated circuit, three-dimensional interconnection routing layout 720 of the integrated circuit, masking patterns (in a set of masking patterns 722) for each of the levels of the integrated circuit and for operations performed to modify those levels (such as, for example, implanting dopants, etching isolation features, and etching lines), and/or a set of executable instructions to perform the operation of method 600.

In some embodiments, the storage medium 704 stores instructions 707 for interfacing with manufacturing machines. The instructions 707 enable processor 702 to generate manufacturing instructions readable by the manufacturing machines to effectively form an integrated circuit during a manufacturing process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, method 600 is implemented in two or more systems 700, and information such as memory type, memory array layout, I/O voltage, I/O pin location and charge pump are exchanged between different systems 700 via network 714.

System 700 is configured to receive information related to an operation of method 600 through I/O interface 710. For example, design documents, decks, and kits are input, in operation 602 of method 600, into storage medium 704 for subsequent analysis. Based on the design documents, decks, and kits input into storage medium 704, design parameters 726 for an integrated circuit are generated, according to instructions 706, and stored in storage medium 704. In some embodiments, design parameters and rules for implementing design parameters 726 are generated and added to instructions 706 to facilitate implementation of method 600 on system 700.

Instructions 706 include instructions regarding decoupling front-end and back-end integrated circuit design parameters during design of an integrated circuit containing low-capacitance ESD device structures, as described in operation 606. Instructions 706 also include design parameters for a number of active lines and a number of pick-up lines in each ESD device connected to a front-end and a back-end ESD device. Instructions 706 include instructions for independently determining an initial layout of a back-end of the integrated circuit as described in operation 608, and an initial layout of a front-end of the integrated circuit as described in operation 610, in order to meet design parameters 726.

Instructions 706 regarding when and how to decouple front-end and back-end integrated circuit design parameters are referenced during the determination of a layout of each level of the integrated circuit, as well as during a layout of the three-dimensional interconnection structure 720 of the integrated circuit. Instructions 706 are used to determine and store, in storage medium 704, a number of interconnection levels 718 for the integrated circuit, and each masking pattern related to forming three-dimensional interconnection structure 720. Individual masking patterns relating to forming the integrated circuit are stored in set of masking patterns 722. Each masking pattern in set of masking patterns 722 is associated with a single level layout stored in set of single level layouts 724 in storage medium 704.

System 700 determines, according to instructions 706 and after independently performing operations 608 and 610 (determining a layout for front-end and back-end circuit elements), whether the layout of the entire integrated circuit conforms to design parameters 726, as described by operation 612. When the layout of the entire integrated circuit does not conform to design parameters 712, system 700 follows instructions 706 to perform operation 614 and adjust at least one of the front-end circuit parameters or the back-end circuit parameters. After adjusting at least one of the front-end circuit parameters or the back-end circuit parameters, system 700 again performs operations 608 and 610 (determining a layout for front-end and back-end circuit elements) and repeats operation 612 until the layout for the entire integrated circuit conforms to design parameters 726.

Upon completion of operation 612 by system 700, system 700 accepts a final layout of the integrated circuit according to operation 616. In some embodiments, accepting a final layout of the integrated circuit includes transferring a copy of instructions 706, the three-dimension interconnection structure 720, the set of masking patterns 722, the set of single level layouts 724, and a layout of the full integrated circuit to a second system 700 to create instructions for making mask layouts for manufacturing the integrated circuit.

Integrated circuits that include a low-capacitance ESD device, such as a circuit layout having FinFETs, are able to be manufactured without additional processing steps (compared to integrated circuits with high-capacitance ESD devices). Modifications to masking patterns for implanting steps, etch steps, and deposition steps are sufficient to create a plurality of low-capacitance ESD devices in an integrated circuit without adding new steps to a manufacturing flow process. Further, decoupling of front-end components and back-end components helps to improve flexibility to adjust locations of components of the ESD device to help performance of an integrated circuit having low-capacitance ESD devices. Layout planning for integrated circuits improves by reducing an amount of area that is used to form ESD devices, and decreases resistance along a dissipation path of the ESD device during an ESD event in comparison with other approaches.

Aspects of the present disclosure relate to an electrostatic discharge (ESD) device. The ESD device includes an active region. The active region includes a first active line having a first plurality of gate features; and a second active line having a second plurality of gate features. The ESD device further includes a first pick-up line having a third plurality of gate features, wherein the first active line is between the first pick-up line and the second active line. The ESD device further includes a second pick-up line comprising a fourth plurality of gate features, wherein the second active line is between the second pick-up line and the first active line.

Aspects of the present disclosure relate to an electrostatic discharge (ESD) device. The ESD device includes a well in a substrate, wherein the well has a first dopant type. The ESD device includes an active region over the well. The active region includes a first active line having a first plurality of gate features. The first active line includes an upper region having a second dopant type opposite the first dopant type. The active region further includes a second active line having a second plurality of gate features. The ESD device further includes a first pick-up line over the well. The first pick-up line has a third plurality of gate features. The first active line is between the first pick-up line and the second active line. The first pick-up line includes an upper region having the first dopant type. The ESD device further includes a second pick-up line over the well. The second pick-up line has a fourth plurality of gate features. The second active line is between the second pick-up line and the first active line. The ESD device has a dissipation path extending from the upper portion of the first active line through the well to the upper region of the first pick-up line.

Aspects of the present disclosure relate to an integrated circuit layout generating system. The integrated circuit layout generating system includes a non-transitory storage medium for storing a set of instructions. The integrated circuit layout generating system further includes a hardware processor communicatively coupled with the non-transitory storage medium and configured to execute the set of instructions. The set of instructions is configured to cause the processor to receive a design of an integrated circuit (IC), to decouple front-end components of the IC from back-end components of the IC, to determine a layout of the back-end components of the IC device, to place the front-end components of the IC device based on the layout of the back-end components, to perform a post-layout simulation based on the layout of the back-end components and the placed front-end components, and to adjust the layout of the back-end components in response to a determination that the post-layout simulation fails to satisfy design requirements of the IC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) device comprising:
   an active region, wherein the active region comprises:
      a first active line comprising a first plurality of gate features; and
      a second active line comprising a second plurality of gate features;
   a first pick-up line comprising a third plurality of gate features, wherein the first active line is between the first pick-up line and the second active line; and
   a second pick-up line comprising a fourth plurality of gate features, wherein the second active line is between the second pick-up line and the first active line.

2. The ESD device of claim 1, wherein a spacing between the first active line and the second active line is greater than a spacing between any two adjacent gate features of the first plurality of gate features.

3. The ESD device of claim 1, wherein a spacing between the first active line and the first pick-up line is greater than a spacing between any two adjacent gate features of the third plurality of gate features.

4. The ESD device of claim 1, further comprising a well in the substrate, wherein the well has a first dopant type.

5. The ESD device of claim 4, wherein the first active line comprises:
   an upper region having a second dopant type, wherein the second dopant type is opposite the first dopant type; and
   a lower region having the first dopant type, wherein the lower region is between the upper region and the well.

6. The ESD device of claim 4, wherein the first pick-up line comprises:
   an upper region having the first dopant type, wherein a dopant concentration of the upper region is greater than a dopant concentration of the well; and
   a lower region having the first dopant type, wherein the lower region is between the upper region and the well.

7. The ESD device of claim 1, further comprising:
   a first isolation feature between the first active line and the second active line; and
   a second isolation feature between the first active line and the first pick-up line.

8. The ESD device of claim 7, wherein the first isolation feature is continuous with the second isolation feature.

9. The ESD device of claim 7, wherein the first isolation feature is different from the second isolation feature.

10. The ESD device of claim 1, further comprising a third pick-up line, wherein the first pick-up line is between the third pick-up line and the first active line, and the third pick-up line comprises a plurality of gate features.

11. An electrostatic discharge (ESD) device comprising:
   a well in a substrate, wherein the well has a first dopant type;
   an active region over the well, wherein the active region comprises:
      a first active line comprising a first plurality of gate features, wherein the first active line comprises an upper region having a second dopant type opposite the first dopant type; and
      a second active line comprising a second plurality of gate features;
   a first pick-up line over the well, wherein the first pick-up line comprises a third plurality of gate features, the first active line is between the first pick-up line and the second active line, and the first pick-up line comprises an upper region having the first dopant type; and
   a second pick-up line over the well, wherein the second pick-up line comprises a fourth plurality of gate features, and the second active line is between the second pick-up line and the first active line,
   wherein the ESD device has a dissipation path extending from the upper region of the first active line through the well to the upper region of the first pick-up line.

12. The ESD device of claim 11, wherein the first dopant type is a p-type dopant.

13. The ESD device of claim 11, further comprising:
   a first isolation structure between the first active line and the second active line; and
   a second isolation structure between the first active line and the first pick-up line.

14. The ESD device of claim 13, wherein a width of the first isolation structure is less than a width of the second isolation structure.

15. The ESD device of claim 13, wherein a width of the second isolation structure is less than a width of a third isolation structure, wherein the third isolation structure is between the second active line and the second pick-up line.

16. The ESD device of claim 11, further comprising a third active line between the first pick-up line and the second pick-up line, wherein the third active line comprises a fifth plurality of gate features.

17. The ESD device of claim 16, wherein the third active line is adjacent to the second active line, and a space between the third active line and the second active line is free of pick-up lines.

18. An integrated circuit layout generating system, comprising:
- a non-transitory storage medium for storing a set of instructions; and
- a hardware processor communicatively coupled with the non-transitory storage medium and configured to execute the set of instructions, the set of instructions being configured to cause the processor to:
  receive a design of an integrated circuit (IC);
  decouple front-end components of the IC from back-end components of the IC;
  determine a layout of the back-end components of the IC;
  place the front-end components of the IC based on the layout of the back-end components;
  perform a post-layout simulation based on the layout of the back-end components and the placed front-end components; and
  adjust the layout of the back-end components in response to a determination that the post-layout simulation fails to satisfy design requirements of the IC.

19. The integrated circuit layout generating system of claim 18, wherein the hardware processor configured to execute the set of instructions, the set of instructions being further configured to cause the processor to:
  generate instructions for forming at least one mask based on the layout of the back-end components and the placed front-end components in response to a determination that the post-layout simulation satisfies the design requirements of the IC.

20. The integrated circuit layout generating system of claim 18, wherein adjusting the layout of the back-end components comprises automatically proposing modifications to the layout of the back-end components in response to the determination that the post-layout simulation fails to satisfy the design requirements of the IC.

* * * * *